(12) United States Patent
Hwang et al.

(10) Patent No.: US 9,485,297 B2
(45) Date of Patent: Nov. 1, 2016

(54) METHOD AND APPARATUS FOR PROVIDING STREAMING DATA ENCODING

(71) Applicant: Samsung Electronics Co., Ltd., Suwon-si, Gyeonggi-do (KR)

(72) Inventors: Sung Hee Hwang, Suwon-si (KR); Se Ho Myung, Seoul (KR); Hyun Koo Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 14/372,509

(22) PCT Filed: Jan. 21, 2013

(86) PCT No.: PCT/KR2013/000468
§ 371 (c)(1),
(2) Date: Jul. 16, 2014

(87) PCT Pub. No.: WO2013/109113
PCT Pub. Date: Jul. 25, 2013

(65) Prior Publication Data
US 2014/0359392 A1 Dec. 4, 2014

Related U.S. Application Data

(60) Provisional application No. 61/588,864, filed on Jan. 20, 2012.

(30) Foreign Application Priority Data

Oct. 9, 2012 (KR) .................. 10-2012-0111998

(51) Int. Cl.
*H03M 13/00* (2006.01)
*H04L 29/06* (2006.01)
(Continued)

(52) U.S. Cl.
CPC ........ *H04L 65/607* (2013.01); *H03M 13/2906* (2013.01); *H04L 1/0065* (2013.01); *H04L 1/0083* (2013.01); *H04L 1/0009* (2013.01)

(58) Field of Classification Search
None
See application file for complete search history.

(56) References Cited

U.S. PATENT DOCUMENTS

| 7,103,830 B1 | 9/2006 | Dong |
| 7,320,099 B2 | 1/2008 | Miura et al. |

(Continued)

FOREIGN PATENT DOCUMENTS

| JP | 2005-110294 A | 4/2005 |
| JP | 2006-67072 A | 3/2006 |

(Continued)

*Primary Examiner* — Daniel McMahon
(74) *Attorney, Agent, or Firm* — Jefferson IP Law, LLP

(57) ABSTRACT

A method for encoding streaming data according to one embodiment of the present invention comprises: a step of dividing a forward error correction (FEC) source block into one or more FEC sub-blocks; a first encoding step of FEC encoding said one or more FEC sub-blocks; a second encoding step of encoding said FEC source block; and a step of generating third encoded data including first encoded data encoded in the first encoding step and second encoded data encoded in the second encoding step. According to one embodiment of the present invention, a streaming service is provided to multiple users in various environments or in a communication environment that varies according to movement or changes in a communication state. Further, a plurality of pieces of parity information is transmitted to provide a streaming service which is capable of high reliability data recovery.

10 Claims, 6 Drawing Sheets

(51) Int. Cl.
*H03M 13/29* (2006.01)
*H04L 1/00* (2006.01)

(56) References Cited

U.S. PATENT DOCUMENTS

| | | |
|---|---|---|
| 7,333,439 B2 | 2/2008 | Itoh et al. |
| 2003/0226089 A1* | 12/2003 | Rasmussen ............ H04L 1/004 714/758 |
| 2004/0101274 A1* | 5/2004 | Foisy ................ H03M 13/3761 386/201 |
| 2006/0077890 A1* | 4/2006 | Suryavanshi ........ H03M 13/05 370/216 |
| 2007/0300134 A1* | 12/2007 | Sugai .................... H04L 1/0045 714/776 |
| 2008/0022345 A1* | 1/2008 | Kim ....................... H04N 7/163 725/131 |
| 2008/0168332 A1 | 7/2008 | Palanki et al. |
| 2009/0274242 A1* | 11/2009 | Kwon .................... H03M 13/63 375/295 |
| 2011/0110437 A1* | 5/2011 | Kim ....................... H04L 1/0072 375/259 |
| 2011/0131474 A1 | 6/2011 | Pandel et al. |
| 2011/0283168 A1 | 11/2011 | Chen et al. |
| 2011/0296270 A1* | 12/2011 | Lim ....................... H04L 1/0041 714/752 |
| 2013/0136193 A1* | 5/2013 | Hwang ................... H04N 7/66 375/240.27 |

FOREIGN PATENT DOCUMENTS

| | | |
|---|---|---|
| JP | 2008-508757 A | 3/2008 |
| KR | 10-2001-0102505 A | 11/2001 |
| KR | 10-2007-0118237 A | 12/2007 |
| KR | 10-2011-0007212 A | 1/2011 |
| WO | 02/098003 A1 | 12/2002 |

\* cited by examiner

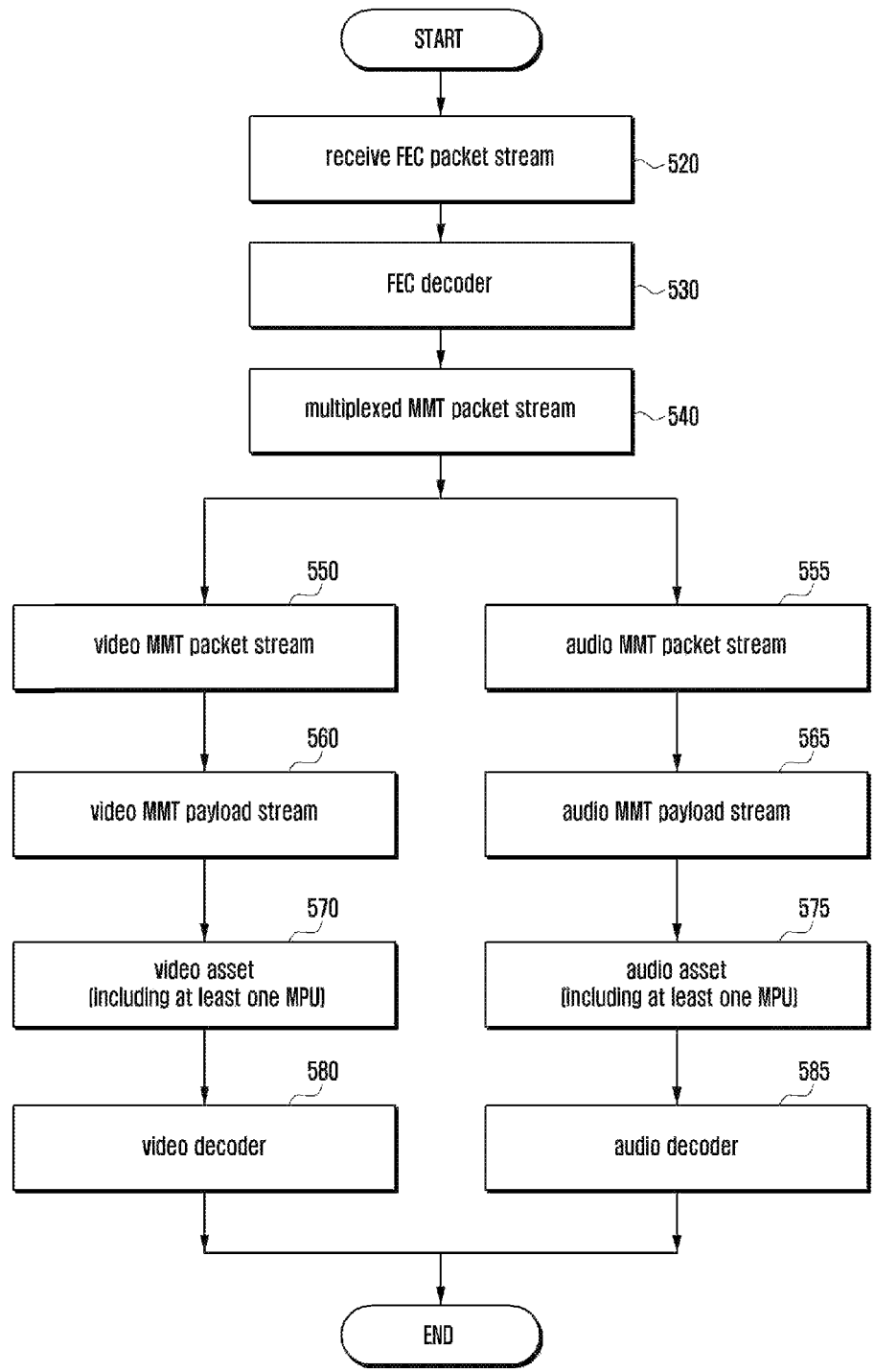

METHOD AND APPARATUS FOR PROVIDING STREAMING DATA ENCODING

TECHNICAL FIELD

The present invention relates to a method and apparatus for providing a streaming service. In particular, the present invention relates to a method and apparatus for providing quality-enhanced streaming service to the users in various communication environments.

BACKGROUND ART

Typically, the (N,K) block code used for streaming services is characterized in that the code rate (=K/N) increases as N increases under the assumption that the channel condition has a fixed Packet Loss Rate (PLR). In contrast, the code rate decreases as N decreases.

Although PRL is fixed, it is necessary to set N to a large value for random loss and a small value for burst loss. Here, if the N increases, this means that the Forward Error Correction (FEC) block interval increases and thus causes delay at the receiver.

This result from the nature of the packet-based network in which the corrupted packets in an FEC block made of N packets can be recovered after the receipt of at least K packets and thus the receiver has to wait for a time period about the FEC block length for FEC decoding.

Typically, it is advantageous to decrease the FEC Block size for the users under good channel condition in the unicast environment because the small FEC block decreases the delay and thus make it possible for the user to enjoy seamless streaming service. In order to provide the service seamlessly the user under the bad communication channel condition, however, it is necessary to use relatively low code rate. In order to secure the transmission efficiency even with the low code rate, it is necessary to increase the FEC block size. However, if the FEC block size increases, this causes relatively long delay of the service.

In the situation whether the streaming service is multicast to a plurality of user or broadcast, some users receive the service on the good channels good (e.g. PLR 1%) while some other users receive the service on the bad channels (e.g. PLR 10%). Also, some users may receive the service in the random packet loss environment and some others in the burst packet loss environment. There is therefore a need of a method for transmitting data to the individual users efficiently in such a situation.

DISCLOSURE OF INVENTION

Technical Problem

The present invention has been conceived to solve the above problem and aims to provide a method and apparatus for providing the streaming service efficiently to the users in various environments or under varying communication conditions on the move.

Solution to Problem

In accordance with an aspect of the present invention, a streaming data encoding method includes dividing a Forward Error Correction (FEC) source block into at least one FEC sub-block, performing first FEC encoding on the at least one FEC sub-block, performing second FEC encoding on the FEC source block, and generating a third encoding data including a first encoding data as a result of the first FEC encoding and a second encoding data as a result of the second FEC encoding.

In accordance with another aspect of the present invention, a streaming data decoding method of a terminal includes receiving streaming data, determining communication environment of the terminal, determining a scheme for decoding the received streaming data depending on the communication environment of the terminal, and decoding the received streaming data with the determined decoding scheme.

Advantageous Effects of Invention

The streaming service provision method and apparatus of the present invention is advantageous in terms of providing the streaming service efficiently to a plurality of users in various environments or under varying communication conditions on the move.

BRIEF DESCRIPTION OF DRAWINGS

FIG. 5b is a diagram illustrating data flows in decoding according to an embodiment of the present invention.

MODE FOR THE INVENTION

Figure 1:
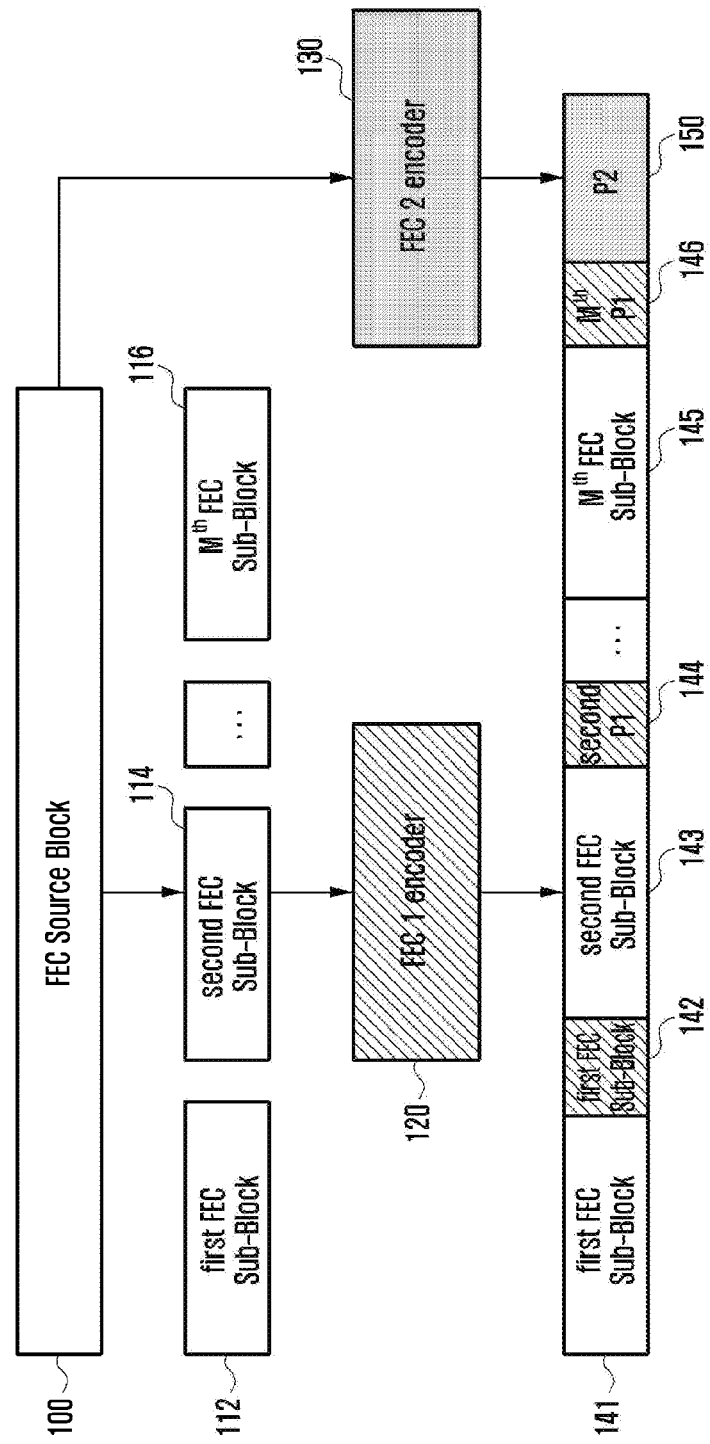
FIG. 1 is a block diagram illustrating an encoding mechanism according to an embodiment.

Exemplary embodiments of the present invention are described with reference to the accompanying drawings in detail.

Detailed description of well-known functions and structures incorporated herein may be omitted to avoid obscuring the subject matter of the present invention. This aims to omit unnecessary description so as to make the subject matter of the present invention clear.

For the same reason, some of elements are exaggerated, omitted or simplified in the drawings and the elements may have sizes and/or shapes different from those shown in drawings, in practice. Exemplary embodiments of the present invention are described with reference to the drawings prepared for explaining a mobile terminal.

In the case that a streaming service is multicast or broadcast, some users (user group A) may receive the streaming service in relatively good channel condition (e.g. PLR 1%) and some others in relatively band channel condition (user group B) as compared to the user group A. The user group A may receive the service in the random packet loss environment while the user group B in the burst packet loss environment. The group to which a user belongs may be switched from the user group A to the user group B as the channel condition for the user varies from good to bad due to the change of surrounding environment or user's location. For example, the channel conditions of some or all users of a group of receiving the streaming service in good channel conditions (low PLR and random loss) may change due to a certain reason such as data congestion so as to be sorted into another group of bad channel conditions (high PLR and burst loss). In a cellular mobile communication environment, a based station has a cell coverage such that the users may be sorted into user group A within the cell coverage and user group B on the cell boundary.

In the situation where a plurality of users receives the same streaming service, if there are multiple user groups receiving the service in different communication environments, it is difficult to adjust a streaming code for the users of a certain group. In more detail, since the streaming service has to be provided to the user groups A and B in the same mode in the multicast or broadcast, it is impossible to determine the per-user code rate based on the user's state unlike the unicast transmission.

Suppose that the same streaming service is provided to the user groups A and B. In this case, if the streaming service is provided with small FEC block, it is necessary to apply a low code rate for the user group B, resulting in reduction of transmission efficiency. In contrast, if the streaming service is provided with large FEC block, the user group A is likely to experience delay in receiving the service in spite of the channel condition good enough to receive the service without delay.

Suppose that the streaming service is served to the users in multicast or broadcast. At this time, the service provider performs data transmission with the code rage and FEC block size determined under the assumption of normal channel condition. However, it may occur that the channel condition deteriorates due to the movement of the user or traffic congestion occurs at a network node in the course of providing the service so as to cause burst packet loss. In such a situation, the burst packet loss makes it impossible to recover the packet loss of the FEC block, resulting in mosaic-like screen distortion or freezing. If the bad channel condition continues, the user cannot receive the service seamlessly.

FIG. 1 is a block diagram illustrating an encoding mechanism according to an embodiment.

Referring to FIG. 1, an FEC source block 100 may be encoded by a plurality of encoders 120 and 130 for providing a streaming service.

In such an environment, the encoding may be performed as follows.

1. Case 0: No coding
2. Case 1: One Stage FEC coding (FEC 2 encoder 130 is skipped)
3. Case 2: One Stage FEC coding (FEC 1 encoder 120 is skipped)
4. Case 3: Two-stage FEC coding (both FEC 1 and 2 encoders 120 and 130 perform encoding)

For reference, FEC 1 encoder 120 and FEC 2 encoder 130 may perform encoding with the same code. Depending on the case, the encoding may be performed at different code rates.

The FEC Source Block 100 includes the data to be provided in the streaming service. The FEC Source Block 100 may be divided into M FEC Sub-Blocks 112, 114, and 116. The Sub-Blocks may differ from each other in size depending on the communication condition. For example, one FEC Sub-Block may be configured to be played in a predetermined time period and, preferably, the size of the Sub-Block may be adjusted such that the data corresponding to the FEC Sub-Blocks are played in equal time period. Also, it is possible to adjust the size of the FEC Sub-Block such that the transmission load is minimized depending on the code rate necessary for the user to receive in consideration of the normal communication environment. The code applied in use of the FEC 1 encoder 120 may be referred to as FEC 1 code, and the coder applied in use of the FEC 2 encoder 130 as FEC 2 code.

The first to $M^{th}$ FEC Sub-Blocks may be encoded by the FEC 1 encoder 120. The data encoded by the first encoder may include the first to $M^{th}$ FEC Sub-Blocks 141, 143, and 145. The first to $M^{th}$ FEC Sub-Blocks 141, 143, and 145 may be identical with or different from the first to $M^{th}$ FEC Sub-Blocks. The first to $M^{th}$ FEC Sub-Block 141, 143, and 145 may include the first to $M^{th}$ parity payload 1 (P1) 142, 144, and 146 for recovery of the first to $M^{th}$ FEC Sub-Block 141, 143, and 145 depending on the encoding result of the FEC 1 encoder 120.

For example, if the first FEC Sub-Block 141 is received, the user may perform error correction to some extent of loss in the first FEC Sub-Block 141 using the first P1 142.

The FEC Source Block 100 may be encoded by the FEC 2 encoder 130. Although it is depicted that the whole FEC Source Block 100 is encoded by the FEC 2 encoder 130, it is also possible to divide the FEC Source Block 100 into Sub-Blocks smaller in size than those encoded by the FEC 1 encoder 120 and encode the Sub-Blocks.

The parity payload 2 (P2) of the FEC Source Block 100 encoded by the FEC 2 encoder 130 may be added to the data to be transmitted. In an embodiment, the data 141 to 150 encoded by the two encoders 120 and 130 may be transmitted to the user. The user can recover any error using the P2 150 even when the received FEC Source Block has some errors.

According to an embodiment, if the data encoded as shown in FIG. 1 is received, the user may play the streaming service as follows.

1. The user group A recovers the corrupted packet using the code of the FEC 1 encoder 120 to receive the service with relatively small delay (fast startup).

2. The user group B recovers the packet of which recovery has failed by the FEC 1 encoder using the code of the FEC 2 encoder 130. Depending on the situation, it is also possible to recover the corrupted packet using the code of the FEC 2 encoder 130 immediately. This is a method which can be proposed when the user group B monitors its communication environment through channel status measurement.

3. A user of the user group A is switched to the user of the user group B, it is possible to recover the corrupted packet using the method of article 2 for consuming the service.

4. A user of the user group B may recover the corrupted packet using the decoding method of article 2 to consume the service and, even after being switched to the user group A afterward, continue using the decoding method of article 2 for consuming the service.

An MMT Package includes MMT-CI, MMT ADC, MMT Asset (Video), and MMT Asset (Audio). Each Asset includes at least one Media Processing Unit (MPU).

The MPUs constituting the Video MMT Asset are packetized into MMT Payload in a transmission order in compliance with the MMT Payload Format for forming MMT Payload stream, and the MPUs constituting the Audio MMT Asset are packetized into MMT Payloads in a transmission order in compliance with the MMT Payload Format for forming MTT Payload stream.

The MMT Payload streams for Video and Audio are multiplexed into MMT packet with the addition of MMT Packet Header so as to be output as an MMT Packet stream.

The MMT Packet Stream may be generated in such a way of adding MMT Packet Header to the respective MMT Payload Streams of video and audio to generate the video and audio streams and multiplexing the video and audio streams into the MMT Packet stream. Here, the multiplexing process may include scrambling MMT payload by MMT payload or MMT packet by MMT packet.

If the MMT Packet is called FEC Source Payload, the MMT Packet Stream, i.e. the FEC Source Payload Stream, is divided into a plurality of FEC Source Blocks 100, and each FEC Source block 100 may be FEC-encoded through the method of case 3 as proposed in FIG. 1. At this time, the FEC Source Block 100 may be divided into M FEC Sub-Blocks 112, 114, and 116.

Also, each FEC Sub-Block may include a predetermined number of FEC Source Payloads. Each FEC Sub-Block encoded into a predetermined number of FEC Parity Payloads using the code of the FEC 1 encoder 120, and the FEC Source Block 100 is encoded into a predetermined number of FEC Parity Payloads (P2 150 in the drawing) using the code of the FEC 2 encoder 130.

Afterward, the MMT Packet Header is added to each FEC Parity Payload to generate the MMT packet. Then an MMT FEC Payload ID is added to each MMT Packet to generate the FEC Packet (FEC Packet for Source Payload is called FEC Source Packet, and the FEC Packet for the Parity Payload is called FEC Parity Packet) which is transferred to a low layer finally.

The MMT FEC Payload ID may be categorized into one of MMT FEC Payload ID for FEC Source Payload and MMT FEC Payload ID for Parity Payload and may include information on Block ID for the receiver to identify the FEC Block, number of FEC Source Payloads in the corresponding FEC Block, number of FEC Parity Payloads, ID (or Sequence Number) for indicating the order of the FEC Source Payloads and FEC Parity Payloads in the FEC Block. The IDs are information capable of allowing the receiver to perform FEC decoding on the packets received in the FEC Packet Block and FEC Packet Sub-Block.

In order to notify the receiver of the FEC coding structure applied by the sender, it is possible to sends the receiver a message informing that the FEC encoding is applied as case 3 in FIG. 1. This message may be stored in an MMT Packet different from or identical with the MMT Packet for the FEC Source Payload and FEC Parity Payload in the FEC Block. The receivers can be aware of the FEC coding structure applied at the transmitter based on the message transmitted by the sender. The information carried in the MMT Packet different from the MMT Packet for the FEC Source Payload and FEC Parity Payload in the FEC Block includes FEC-related messages such as FEC 1 code ID, FEC 2 code ID, and Mode for conversion from FEC Source Block to FEC Information Block as well as FEC coding structure. There may be a separate MMT Packet carrying the information on MMT-CI and MMT-ADC transmission and content consumption-related information.

Afterward, the receiver acquires the transmission and content consumption-related information and FEC-related messages carried in the separate MMT packet and FEC Block ID and FEC Decoding-related information based on the MMT FEC Payload ID of the received MMT packet so as to recover the corrupted packets in the corresponding FEC Packet Block and FEC Packet Sub-Block.

At this time, the user group A regenerates the FEC Block from the FEC Source Packet and related FEC Parity Packets in the FEC Packet Sub-Block encoded with the FEC 1 code and performs FEC decoding on the FEC Block to recover the corrupted FEC Source Payload and, when the FEC 1 code-based FEC decoding fails, the user group B regenerates the FEC Block from the FEC Source Packet and related FEC Parity Packets in the FEC Packet encoded with the FEC 2 code and performs FEC decoding on the FEC Block to recover the corrupted FEC Source Payload.

Although two FEC encoders are shown in the drawing, the encoding processes may be performed by the same encoder in parallel.

Figure 2:
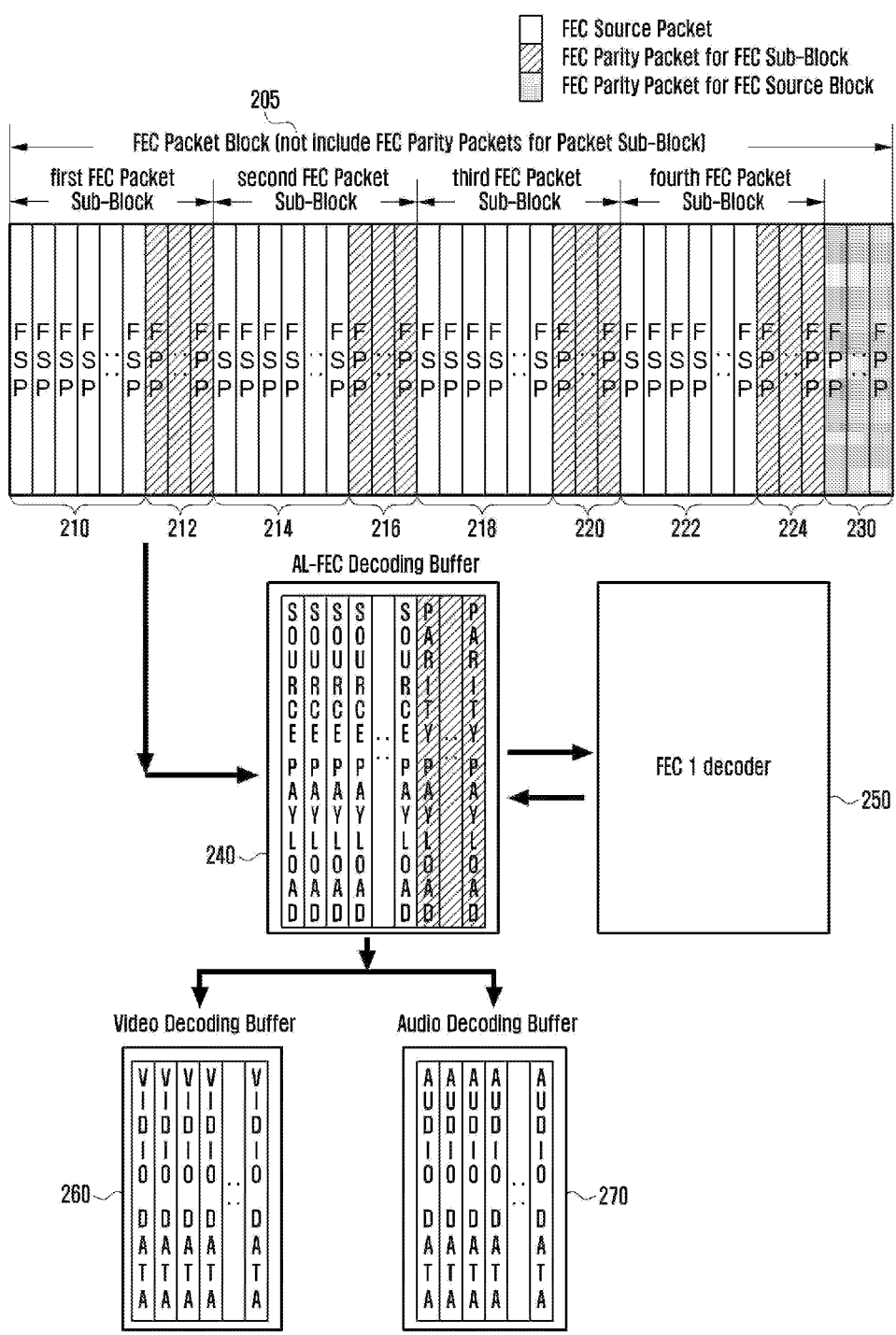
FIG. 2 is a diagram illustrating a decoding method according to the first embodiment of the present invention.
Figure 3:
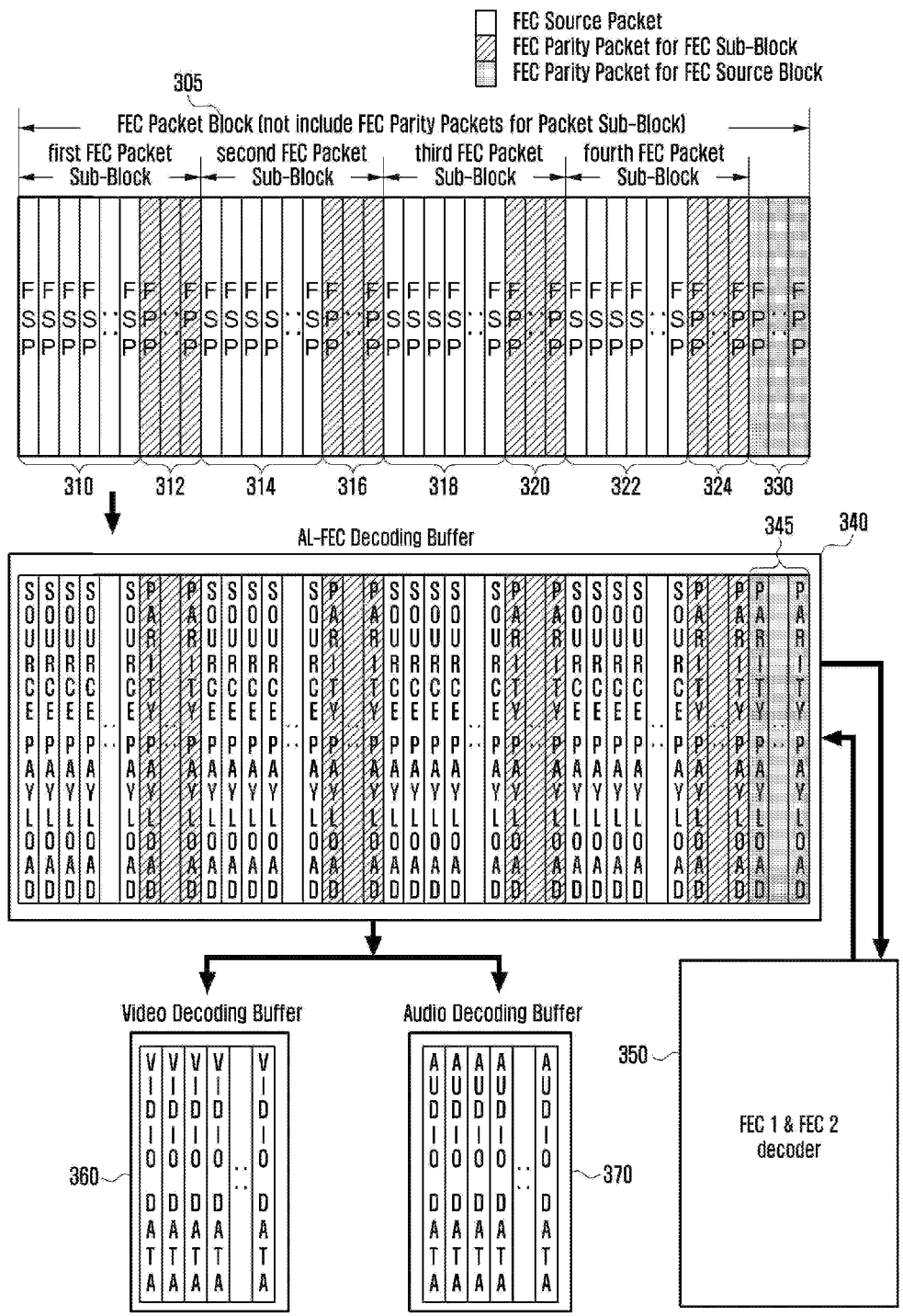
FIG. 3 is a diagram illustrating a decoding method according to the second embodiment of the present invention.

FIG. 2 is a diagram illustrating a FEC buffering model for decoding by user group A, and FIG. 3 is a diagram illustrating FEC buffering mode for decoding by user group B.

Referring to FIGS. 2 and 3, in the case of a user belonging to the user group A, the AL-FEC decoding buffer 240 may store the received FEC Source Payload and FEC Parity Payload included in the FEC Packet Sub-Blocks 210 to 224 in an order indicated in the MMT FEC Payload ID. At this time, the position of the FEC Source Payload which is not received yet may be left as empty, and the FEC Source Payloads may be received simultaneously through a plurality of buffers depending on the embodiment.

If the payload at least equal to or greater than the number of FEC Source Payload is secured to prepare for decoding, the AL-FEC decoding buffer 240 delivers the payload to the FEC 1 decoder 250 by erasing the missed FEC Source or Parity Payload.

The FEC 1 decoder 250 may perform FEC 1 decoding using the input FEC Source Payload and FEC Parity Payload, and Erasure positions information and store the recovered FEC Source Payload in the AL-FEC decoding buffer 240. If the corresponding FEC block has been decoded completed, the AL-FEC decoding buffer 240 de-packetizes the FEC Source Payload (in inverse order of MMT Packetization of MMT Payload in MPU) and sends the de-packetization result to the video decoding buffer 260 and the audio decoding buffer 270.

Afterward, each Media decoding buffer performs media decoding and displays media to provide finally the user with the streaming service. In this way, the user group A stores the FEC Packet Sub-Blocks to perform FEC decoding other than storing the FEC Packet Block 205 in the AL-FEC decoding buffer 240 so as to play the contents with small FEC delay.

Referring to FIG. 3, in the case of the user belonging to the user group B, the AL-FEC decoding buffer 340 stores the received FEC Source Payload and FEC Parity Payload included in the FEC Packet Sub-Block in the order of FEC Packet Sub-Blocks 310 to 324 in and order indicated by MMT FEC Payload IDs and performs FEC decoding using the FEC 1 decoder as the user group A. If the entire FEC packet Sub-Blocks in the FEC Packet Block are decoded successfully using the FEC 1 decoder, the Source Payloads corresponding to the Source Block are de-packetized and transferred to the media decoding buffers 360 and 370 so as to finally provide the user with the streaming service.

If it fails decoding at least one FEC Packet Sub-Block in the FEC Packet Block, it is possible to decode the FEC Source Payload which has not been recovered using the FEC Parity Payload 345.

After the additional recovery, the AL-FEC Decoding buffer 340 de-packetizes the Source Payloads corresponding to the FEC Source Block 305 and sends the de-packetized payload to the media decoding buffers 360 and 370 so as to finally provide the user with the streaming service.

According to an embodiment, if it is predicted that a user belonging to the user group A fails FEC-decoding on the FEC Packet Sub-Block frequently so as to cause user's inconvenience, the user extends the AL-FEC Decoding Buffer as shown in FIG. 3 to be a member of the user group B so as to receive the service by performing the FEC decoding as the user in the user group B. In the case where it is impossible to perform decoding with the FEC 1 decoder due to the burst packet loss on the channel abruptly in the course of performing FEC decoding in the user group A, it is possible to receive the service of good quality by switching to the user group B.

The decoding-capable terminal may include at least one decoder capable of performing FEC decoding and a control unit for controlling the at least one decoder.

Figure 4:
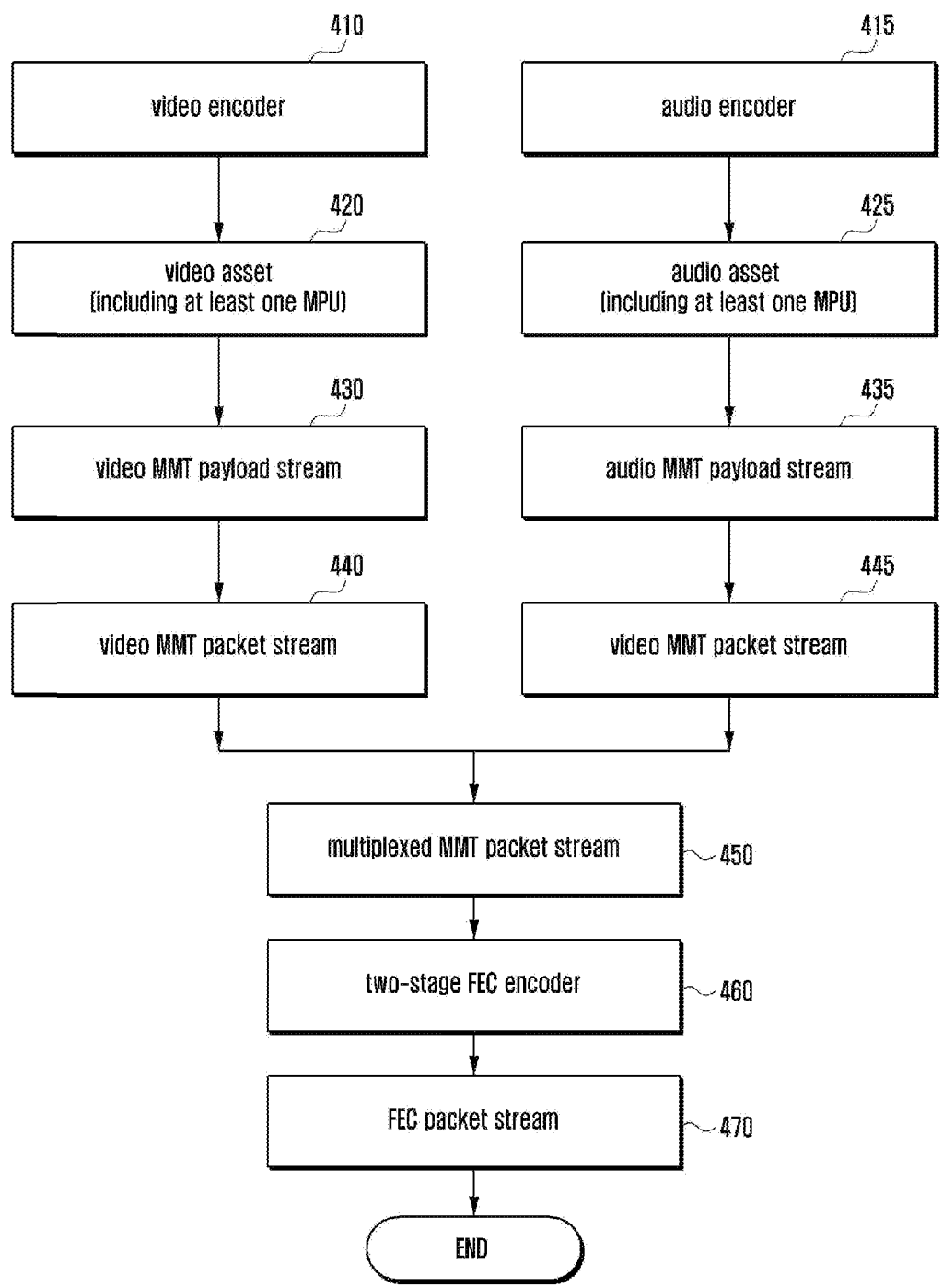
FIG. 4 is a diagram illustrating data flows in encoding according to an embodiment of the present invention.

FIG. 4 is a diagram illustrating data flows in encoding according to an embodiment of the present invention.

Referring to FIG. 4, the video and audio encoders 410 and 415 encode the video and audio contents into a Video Asset 420 made up of one or more MPUs and an Audio Asset made up of one or more MPUs, the MPUs being packetized into the MMT Payload to be fit for the MMT Payload Format so as to generate MMT Payload Streams 430 and 435. Afterward, an MMT Packet Header is added to each MMT Payload to generate MMT Packet Streams 440 and 445. The generated Video MMT Packet Stream 40 and the Audio MMT Packet Stream 445 are multiplexed into an MMT Packet Stream 450.

The multiplexed MMT Packet Stream 450 is divided into source blocks each made up of a plurality of MMT packets for FEC encoding. The source blocks may be encoded by the FEC 1 encoder and the FEC 2 encoder to generate Parity Payloads as in case 3 of FIG. 1.

MMT FEC Payload IDs are added to the FEC-protected MMT packets, and MMT FEC Payload ID and MMT Packet Header are added to the parity Payload such that the FEC packet Stream 470 is provided to the user.

Figure 5A:
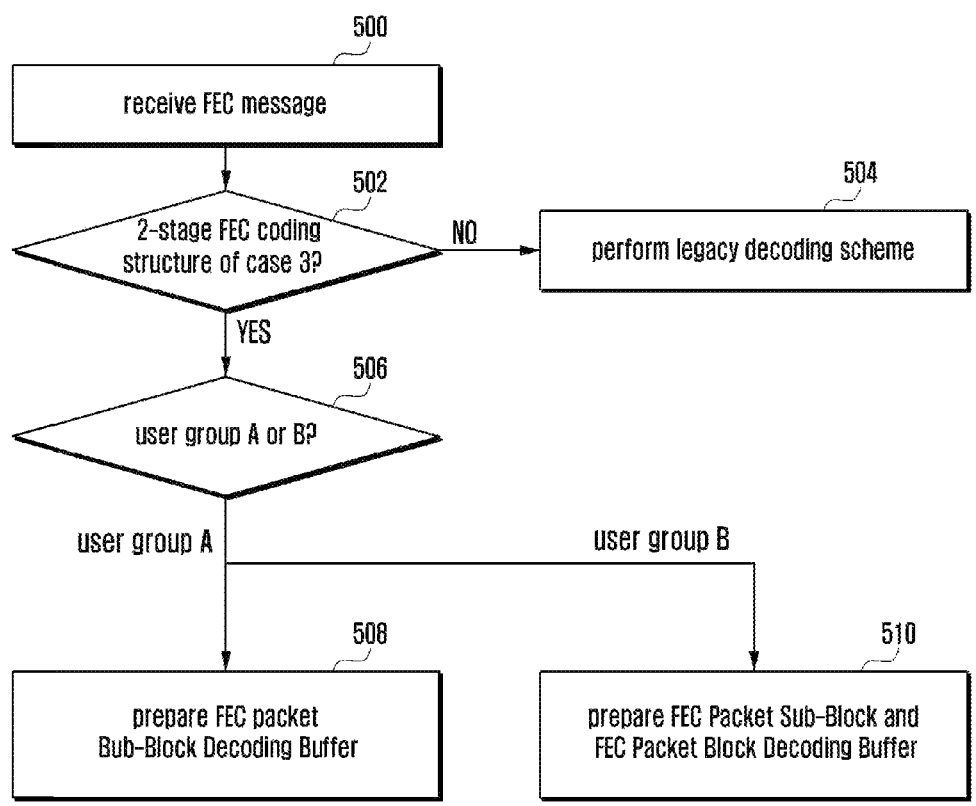
FIG. 5a is a flowchart illustrating a decoding method according to an embodiment of the present invention.

FIG. 5a is a flowchart illustrating a decoding method according to an embodiment of the present invention.

Referring to FIG. 5a, the recipient terminal receives an FEC message for FEC decoding on the streaming service at step 500. The terminal may determine FEC packet stream decoding mode based on the received FEC message at step 502. If the received FEC Packet stream has been encoded in the mode as case 3 of the present invention, the procedure goes to step 506 and, otherwise, performs decoding in the legacy mode at step 504.

The terminal may determine whether the communication environment of the terminal corresponds to the user group A or the user group B at step 506. The terminal may determine the communication environment based on channel condition measurement. The terminal may determine the communication environment of the terminal depending on whether the received FEC Packet Stream is decoded successfully. Whether the receiver belongs to the user group A or the user group B may be determined based on the prediction of corrupted MMT Packet rate in the sequences of the FEC Message and FEC encoding-related information (e.g. FEC Source Packet of the FEC Packet Sub-Block and number of FEC Parity Packets) or the channel condition of its feedback channel.

If it is determined that the communication environment of the terminal matches the user group A, the terminal may prepares the FEC decoding buffer for the FEC 1 decoder to perform decoding in unit of FEC packet Sub-Block at step 508.

If it is determined that the communication environment of the terminal matches the user group B, the terminal may prepare the FEC decoding buffers for the FEC 1 decoder and the FEC 2 decoder to perform decoding in unit of FEC Packet Sub-Block and FEC Packet Block at step 510.

FIG. 5b is a diagram illustrating data flows in decoding according to an embodiment of the present invention.

Referring to FIG. 5b, if FEC decoding is prepared after the receipt of the FEC message, the terminal receives the FEC Packet Stream at step 520.

The terminal acquires MMT FEC Payload ID information in the FEC Packet and performs FEC decoding on the received FEC Source Payload (MMT Packet) and FEC Parity Payload corresponding to the FEC Block at step 530. The decoding may be performed as described with reference to FIGS. 2 and 3.

The terminal recovers the corrupted FEC Source Payload through FEC decoding and generates multiplexed MME Packet Stream at step 540.

The terminal splits the MMT Packet stream into video MMT Packet stream 550 and audio MMT Packet stream 550.

The terminal extracts video MMT Payload Stream 560 and audio MMT Payload Stream 565, checks MMT Header and performs de-packetizes to generate Video Asset 570 and Audio Asset 575 made up of MPUs. The MPUs are input to the video and audio decoders 580 and 585 so as to be decompressed and played.

It is to be appreciated that those skilled in the art can change or modify the embodiments without departing the technical concept of this invention. Accordingly, it should be understood that above-described embodiments are essentially for illustrative purpose only but not in any way for restriction thereto. Thus the scope of the invention should be determined by the appended claims and their legal equivalents rather than the specification, and various alterations and modifications within the definition and scope of the claims are included in the claims.

Although preferred embodiments of the invention have been described using specific terms, the specification and drawings are to be regarded in an illustrative rather than a restrictive sense in order to help understand the present invention. It is obvious to those skilled in the art that various modifications and changes can be made thereto without departing from the broader spirit and scope of the invention.

The invention claimed is:
1. A streaming data encoding method comprising:
dividing a forward error correction (FEC) source block into at least one FEC sub-block;
performing first FEC encoding on the at least one FEC sub-block;
performing second FEC encoding on the FEC source block; and
generating a third encoding data including a first encoding data as a result of the first FEC encoding and a second encoding data as a result of the second FEC encoding, wherein the first encoding data includes an encoded FEC sub-block and a first parity payload of the encoded FEC sub-block, and the second encoding data includes a second parity payload of an encoded FEC source block.

2. The method of claim 1, wherein dividing the FEC source block into the at least one FEC sub-block comprises defining a playback time of data included in the at least one FEC sub-block within a predetermined range.

3. The method of claim 1, wherein generating the third encoding data comprises generating data including the first encoding data and a parity packet for the FEC source block generated as a result of the second FEC encoding.

4. The method of claim 1, wherein dividing the FEC source block into the at least one FEC sub-block comprises determining a size of the FEC sub-block dynamically depending on a streaming data transmission environment.

5. The method of claim 1, wherein the first FEC encoding and the second FEC encoding are performed with same encoding scheme.

6. A streaming data decoding method of a terminal, the method comprising:
    receiving streaming data;
    determining whether a first Forward Error Correction, FEC, encoding has been performed on at least one FEC sub-block that has been divided from a FEC source block of the streaming data, and a second FEC encoding has been performed on the FEC source block;
    determining a communication environment of the terminal;
    determining a scheme for decoding the received streaming data based on the communication environment of the terminal; and
    decoding the received streaming data with the determined decoding scheme,
    wherein the first FEC encoding is associated with an encoded FEC sub-block and a first parity payload of the encoded FEC sub-block, and the second FEC encoding is associated with a second parity payload of an encoded FEC source block.

7. The method of claim 6, wherein receiving the streaming data comprises:
    receiving a forward error correction (FEC) message; and
    selecting a set of decoding schemes based on the received FEC message.

8. The method of claim 6, wherein determining the communication environment of the terminal comprises determining the communication environment of the terminal based on a communication channel condition measured by the terminal or reported.

9. The method of claim 6, wherein decoding the received streaming data comprises decoding, when decoding fails with the determined decoding scheme, the received streaming data using another decoding scheme different from the determined decoding scheme.

10. The method of claim 9, wherein the another decoding scheme is to decode the received streaming data based on a parity packet of an FEC packet block of the received streaming data.

\* \* \* \* \*